United States Patent [19]

Simmons

[11] Patent Number: 4,806,792

[45] Date of Patent: Feb. 21, 1989

[54] DIFFERENTIAL AMPLIFIER CIRCUIT

[75] Inventor: Elmer Simmons, Whitman, Mass.

[73] Assignee: Digital Equipment Corporation, Maynard, Mass.

[21] Appl. No.: 69,407

[22] Filed: Jul. 1, 1987

[51] Int. Cl.$^4$ ............................................. H03K 5/22
[52] U.S. Cl. .................................... 307/357; 330/252; 365/208
[58] Field of Search ............... 330/252; 307/355–358, 307/494, 530, 455; 365/207, 208

[56] References Cited

U.S. PATENT DOCUMENTS 3,585,510  6/1971  O'Malley ........................ 307/494 X
4,498,054  2/1985  Fukuda et al. .................. 330/252 X
4,713,560  12/1987  Herndon ........................... 307/455

Primary Examiner—James B. Mullins
Attorney, Agent, or Firm—Fish & Richardson

[57] ABSTRACT

A new differential amplifier circuit including two current mode logic circuits, each comprising a pair of transistors whose emitters are connected to a common current source. The differential amplifier circuit receives three input signals, with a transistor in both of the current mode logic circuits being controlled by one of the input signals. The collector outputs of the two transistors controlled by a single input signal are connected together, and the collector outputs of the two transistors controlled by the other two input signals are also connected together, in both cases to form summing junctions. The summing junctions are connected to an output buffer to generate a pair of signals constituting differential output signals.

9 Claims, 2 Drawing Sheets

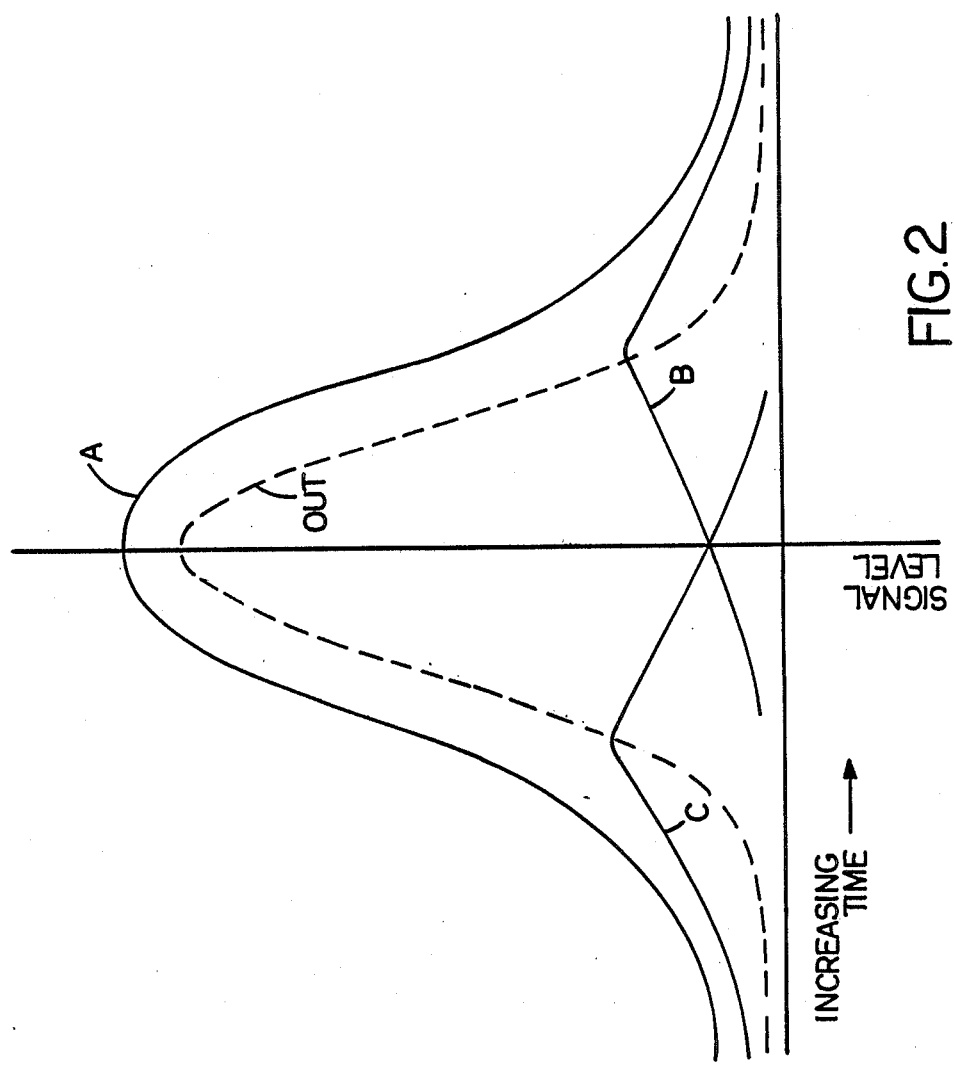

DIFFERENTIAL AMPLIFIER CIRCUIT

BACKGROUND OF THE INVENTION

1. Field of the Invention

The invention relates generally to the field of differential amplifier circuits, and specifically provides a dual differential amplifier circuit that is useful in shaping waveforms of electrical signals.

2. Background

In a digital data processing system, mass storage devices record digital data on, typically, magnetic storage media which moves relative to a transducer or read/write head. The digital data is represented as a series of transitions in the magnetic field recorded on the media as it moves relative to the read/write head. An electrical current is applied to the head, which generates a magnetic field in response thereto. The direction of the magnetic field varies in response to the applied electrical signal, which, in turn, varies in response to the data to be written. Accordingly, the magnetic field written on the media corresponds to the digital data.

After the magnetic signal is recorded on the media, the read/write head can read the signal and provide an electrical signal which can be used to determine the stored data. In this process, the read/write head is placed adjacent to the portion of the media in which the data was previously written. The media moves relative to the read/write head so that the previously recorded magnetic field generates an electrical signal. Specifically, the transitions in the recorded magnetic field cause variations in the electrical signal, which, in turn, are processed to recover the recorded digital data.

The electrical signal from a typical read/write head is very small. That is, the peak-to-peak voltage of the signal, which is a measure of the voltage difference of the signal between the positive peak and the negative peak, or valley, in the signal that is received from a read/write head in a typical mass-storage device is not very large, and it is difficult to distinguish from the background noise which is present in any system. Furthermore, as data is recorded on media at higher recording densities, typically the electrical signal from a read/write head is reduced and the noise increased.

The timing of a peak or valley in a recorded signal relates to the passage of the transducer over the location of a transition in the magnetic field recorded on the disk. It is used not only in determining the stored data but also in providing several timing signals which are used to determine the stored data, particularly difficult. As the recording densities increase, however, the timings between peaks and valleys concomitantly decrease, and the transitions become closer together. As a result, the read/write head is affected not only by the magnetic fields defining the transition proximate the head, but also by magnetic fields defining adjacent transitions, resulting in "peak shift" or "intersymbol interference" between adjacent the positive and negative peaks. The presence of peak shift in a read signal increases the difficulty of precisely identifying the timings of the peaks and valleys in the signal received from a read/write head. Accordingly, complicated electrical equalizing circuit such as cosine filters have been developed as pulse slimmers to reduce the width of the read pulse and help locate the peaks and valleys of the read signal.

Differential amplifiers are often used in a number of applications, including data recovery in a mass storage device, to provide enhanced sensitivity and reduction in noise. In a conventional differential amplifier, the output signal is essentially the result of a comparison between two input signals from a signal source; that is, the output signal is related to the difference between the input signals from the signal source. Since normally input signals from a single source will have common noise patterns, differencing the signals cancels out at least the common noise. The elimination of the noise common to the two input signals further enhances the usable sensitivity of the circuit to the desired input signal. A typical differential amplifier, however, does not assist in processing the signal to identify the peaks and valleys therein.

SUMMARY OF THE INVENTION

The invention provides a new and improved differential amplifier circuit. The invention specifically provides a new differential amplifier circuit which is particularly useful in receiving, amplifying and processing signals from a transducer in a mass storage device in a digital data processing system, to better enable the identification of extremes, that is, the peaks and valleys, in the electrical signal therefrom, which, in turn, assists in better identifying the location of the transitions in the recorded magnetic field.

In brief summary, the new differential amplifier circuit includes two current mode logic circuits, each comprising a pair of transistors whose emitters are connected to a common current source. The differential amplifier circuit receives three input signals, with a transistor in both of the current mode logic circuits being controlled by one of the input signals. The collector outputs of the two transistors controlled by a single input signal are connected together, and the collector outputs of the two transistors controlled by the other two input signals are also connected together, in both cases to form summing junctions. The summing junctions are connected to an output buffer to generate a pair of signals constituting differential output signals.

In one embodiment, in which the differential amplifier circuit is used in a pulse slimming circuit to process a read signal from a transducer so as to minimize peak shift and facilitate accurate timings of the recorded transitions, the input signals to the differential amplifier circuit are provided by a delay circuit. The delay circuit provides a total delay corresponding to one-half the amplitude width of the read signal, that is, the time between the points on the leading and trailing edges of the read signal at which its amplitude is one half of its maximum. The single input signal controlling transistors in both current mode logic circuits comprises a signal from the center of the delay circuit, and thus constitutes one half of the total delay provided thereby. The other two input signals are related to the signals at the ends of the delay circuit, and specifically comprise a fraction of the respective signals at the input and output of the delay circuit. The input signals from the ends of the delay circuit constitute correction values which help to shape the waveform of the differential output signal which is otherwise related to the input signal from the center of the delay circuit. The applied correction provides slimmer peaks in the differential output signal.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 2 depicts a timing diagram which assists understanding the operation of the circuit depicted in FIG. 1.

DETAILED DESCRIPTION OF AN ILLUSTRATIVE EMBODIMENT

Figure 1:
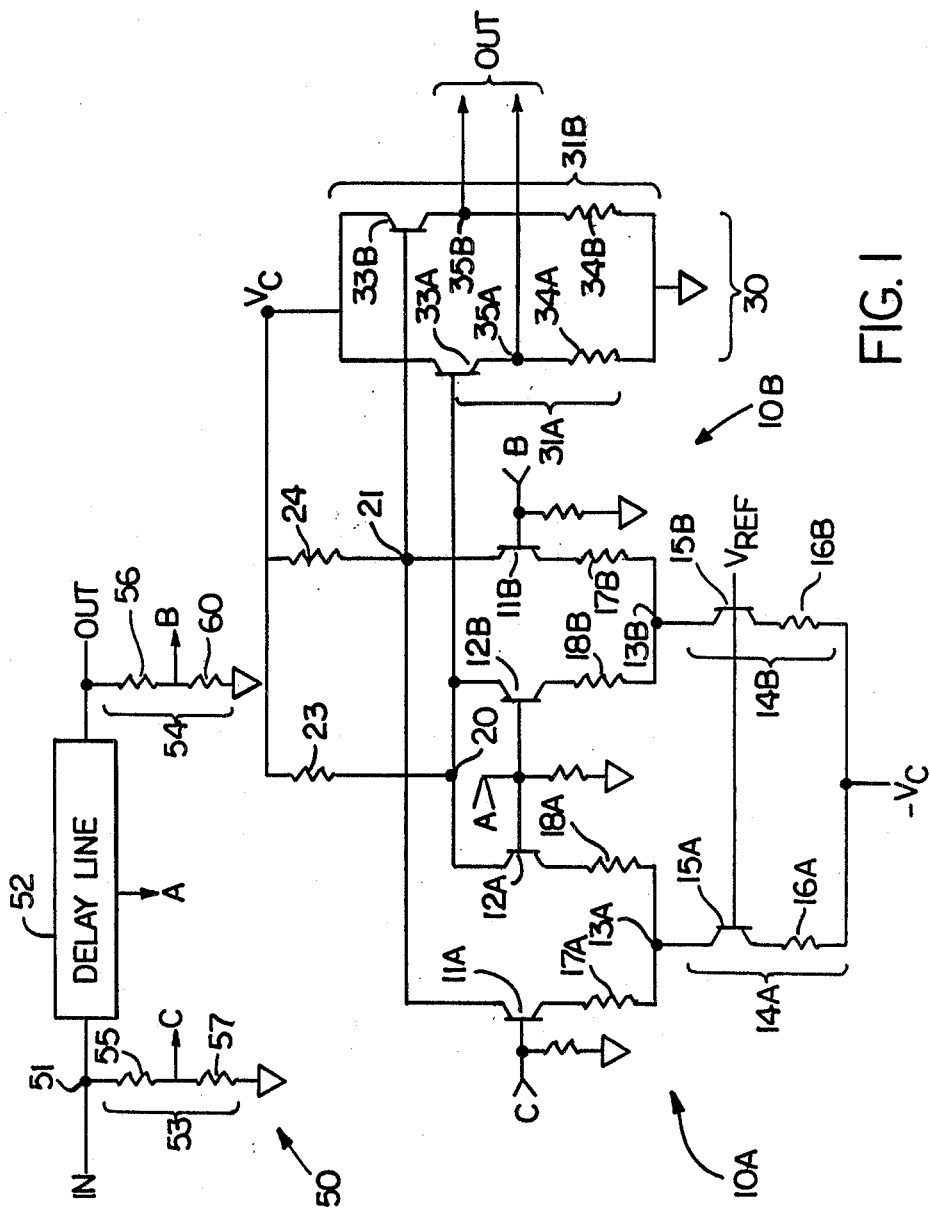
FIG. 1 depicts a schematic circuit diagram of a differential amplifier circuit constructed in accordance with the invention.

With reference to FIG. 1, a differential amplifier constructed in accordance with the invention includes two current mode logic circuits 10A and 10B which are connected together to provide switch output signals at switch output nodes 20 and 21. The switch output nodes 20 and 21 are, in turn, connected to an output buffer 30 specifically controlling two emitter follower circuits 31A and 31B for providing a differential output signal.

Current mode logic circuit 10A operates in response to A and C input signals, and circuit 10B operates in response to the B input signal as well as the same A input signal as switch 10A. Since the two switches 10A and 10B have the same structure and operate in the same way, only swtich 10A will be described in detail. The corresponding elements of the two circuits are identified by the same reference numeral, and are distinguished by the suffixes A and B.

Specifically, current mode logic circuit 10A includes two current steering transistors 11A and 12A whose emitter terminals are coupled through resistors 17A and 18A, respectively, to a current source node 13A. A current source 14A, which is also connected to the current source node 13A, includes a transistor 15A which is controlled by a reference voltage $V_{REF}$ and whose emitter is connected to a negative power supply $-V_c$ through a resistor 16A. The reference voltage $V_{REF}$ maintains the transistor 15A at a selected operating point so as to sink a predetermined amount of current from node 13A.

The collectors of transistors 12A and 12B are connected together to form one switch output node 20, and the collectors of transistors 11A and 11B are connected together to form the second switch output node 21. Nodes 20 and 21 are connected through corresponding load resistors 23 and 24 to a $V_c$ power supply.

Since the emitter follower circuits 31A and 31B are also identical, only emitter follower circuit 31A will be described in detail. Corresponding elements in the two emitter follower circuits 31A and 31B are identified by the same reference numeral except for the A and B suffix. Emitter follower circuit 31A includes a transistor 33A whose base terminal is controlled by the signal at node 20. The transistor's collector terminal is connected to the $V_c$ power supply, and the emitter is connected to a node 35A which is also connected through an emitter resistor 34A to ground. One of the two signals comprising the differential output signal OUT is provided by node 35.

In operation, transistors 11A and 12A in current mode logic circuit 10A, and transistors 11B and 12B in current mode logic circuit 10B are all biased so that they are normally conducting. Variations in the voltage waveforms of input signals A, B and C cause concomitant variations in the respective current flows through transistors 11a, 11B, 12A and 12B which are reflected in variations in the current flows through load resistors 23 and 24. The variations in current flows through the load resistors 23 and 24, in turn, cause variations in the voltage levels of node 20 and 21. As a result of the variations in the voltage levels of nodes 20 and 21, the voltage waveforms of the OUT differential output signals from emitter followers 31A and 31B also vary.

Specifically, with respect to current mode logic circuit 10A, if the A and C input signals both have selected voltage levels, the transistors 11A and 12A conduct the same amount of current from respective nodes 20 and 21 to node 13A. The current source 14A controls the amount of current that is allowed to flow out of node 13A. Since the currents from nodes 21 and 20, respectively, through transistors 11A and 12A are the same, the voltage level at nodes 20 and 21, which are due to voltage drops across resistors 23 and 24, respectively, are also the same. Accordingly, the voltage levels applied to the bases of transistors 33A and 33B are the same, and so the currents output from the emitters of the two transistors 33A and 33B into resistors 34A and 34B are also the same. Accordingly, the voltage levels of the two nodes 35A and 35B, with respect to ground, which provide the two OUT differential output signals, are also the same.

If the voltage level of one of the input signals, for example, the A input signal, increases with respect to the C input signal, the transistor 12A conducts a greater amount of current to node 13A. As a result, the current which is conducted through transistor 11A decreases. Since a greater amount of current flows from node 20 to node 13A, and less from node 21 through transistor 11A, more current flows through load resistor 23, resulting in a greater voltage drop at node 20, and less current flows through load resistor 24, resulting in a lesser voltage drop at node 21. Accordingly, the voltage applied to the base of transistor 33B increases and the voltage applied to the base of transistor 33A decreases. As a result, transistor 33B conducts more current toward node 35B, resulting in an increase in the voltage level at node 35B, and transistor 33A conducts less current toward node 35A, resulting in a decrease in the voltage level at node 35A. The voltage levels of the two signals comprising the OUT differential output signal change in a corresponding manner.

It will be appreciated that, if the voltage level of the A input signal decreases with respect to the C input signal, the voltage level of node 35A will increase and the voltage level of node 35B will decrease, resulting in a corresponding change in the voltage levels of the two signals comprising the OUT differential output signal.

In addition, it will be appreciated that the current mode logic circuit 10B operates in a manner similar to that of the current mode logic circuit 10A. Thus, the current flow from node 21 through transistors 11A and 11B is essentially the sum of the currents through the two transistors 11A and 11B, and the current flow from node 20 through transistors 12A and 12B is essentially the sum of the currents through the two transistors 12A and 12B. Thus, the circuit depicted in FIG. 1 provides a differential output signal which is essentially a comparison of the A input signal, on the one hand, and the B and C input signals on the other hand.

The differential circuit depicted in FIG. 1 is particularly useful in processing a signal whose voltage variations occur in identifiable sequential timeslots, such as would occur in connection with a signal from a transducer which reads magnetic signals from a disk in a mass storage subsystem used in a digital data processing system. In a mass storage subsystem, a magnetic signal written onto a disk has periodic transitions which represent digital data. The transitions occur at a selected maximum rate, that is, in a selected minimum time interval. A typical transducer which is used to read the magnetic signal provides an electrical signal which has a waveform that is essentially the derivative of the magnetic signal which it reads from the disk. The electrical signal has positive and negative peaks (that is, peaks and valleys) which substantially correspond to the transitions in the magnetic field sensed by the transducer.

As a result of the variable nature of the magnetic transitions recorded on the disk, the waveforms are typically asymmetrical, which can cause the sensed peak to be advanced or delayed from the actual peak. This is a result, in part, of the peak shift in the read signal resulting from intersymbol interference between transitions in high-density recording. It is desirable to process the waveform to reduce or eliminate the peak shift and to permit downstream processing circuitry to identify the timings of the extremes of the peaks in the waveform of the signal from the read/write transducer. To accomplish this, the dual differential amplifier depicted in FIG. 1 is connected to a delay circuit 50 which provides as the A input signal to transistors 12A and 12B in current mode logic circuits 10A and 10B an IN input signal from the magnetic transducer, and as B and C input signals to transistors 11A and 11B correction voltage signals which enable the dual differential amplifier circuit to provide the desired waveform.

Specifically, the delay circuit 50 receives an IN input signal from a transducer at an input node 51. The IN input signal is coupled to the input terminal of a delay line 52 and also is applied to a voltage divider circuit 53. The voltage divider circuit 53 provides the C input signal, which is coupled to the base terminal of transistor 11A in current mode logic circuit 10A.

The output terminal of delay line 52 provides a DEL OUT delay output signal which is identical to the IN input signal, delayed by a predetermined amount of time. The output terminal of the delay line 52 is connected to a second voltage divider 54 which provides the B input signal, which is coupled to the base terminal of transistor 11B in current mode logic circuit 10B.

The respective resistors forming the voltage dividers 53 and 54 are selected so that the voltage levels of the B and C input signals in response to a peak in the IN input signal will be the same, although the peak in the B input signal will be delayed in time from the peak in the C input signal. That is, the resistor 55 in voltage divider 53 connected to node 51 has the same value as the resistor 56 connected to the output terminal of delay line 52 in voltage divider 54. In addition, the resistor 57 connected to ground in voltage divider 53 has the same value as the resistor 60 connected to ground in voltage divider 54. Since the voltage output from the node between two resistors in a voltage divider corresponds to the voltage level of the input multiplied by ratio of the resistances, it will be recognized that the maximum voltage level of the C and B input signals is a selected fraction of the maximum voltage level of the A input signal. The resistor values are selected so that the peak values of the B and C input signals are somewhat smaller than the peak values of the A input signal, the amount being determined by the amount of correction desired. In one embodiment, the resistor values in the voltage dividers 53 and 54 are selected so that maximum values of the B and C input signals are approximately one-fourth the maximum value of the A input signal.

With these resistors, the base resistors depicted in the base terminals of the transistors 11A, 11B, 12A and 12B are not necessary.

The delay provided by the delay line 52 is selected to be approximately one-half the amplitude width of an isolated peak or valley of the read signal which has not been corrupted with intersymbol interference. That is, the delay time is the amount of time between the points on the leading and trailing edges of the read signal at which its amplitude is one half of its maximum. The differential amplifier circuit uses the correction values, which are the B and C input signals, and the waveform value, which is the A input signal taken from the delay line 52, to produce, as the OUT differential output signal, a processed waveform signal which has the desired sharp peak characteristic.

The effect of the delay line 52 on a read signal from a transducer will be explained in connection with FIG. 2. With reference to FIG. 2, the curves marked A, B, and C depict the A, B and C input signals, respectively, from the delay line circuit depicted in FIG. 1. It will be appreciated that the amplitudes of the B and C input signals at each point are approximately one-fourth the amplitude of the A input signal, displaced by one-half the delay time provided by the delay line 52. That is, since the C and B input signals are advanced and delayed, respectively from the A input signal by one-half the delay time provided by delay line 52, and because the maximum signal level provided by voltage dividers 53 and 54 is one-fourth the maximum at the terminal providing, the A, B and C input signals to the differential amplifier circuit in FIG. 1 are as depicted in FIG. 2. Accordingly, the OUT differential output signal will have the curve depicted in FIG. 2 in broken lines. The curve representing the OUT differential output signal will have a somewhat lower amplitude than the A input signal, which has the same amplitude as the IN input signal. However, the OUT differential output signal will also have the desired much slimmer peak.

It will be appreciated by those skilled in the art that the differential amplifier circuit depicted in FIG. 1 may be extended by providing additional current mode logic circuits, each having one transistor connected to receive the A input signal and the other transistors connected to receive additional input signals (not shown). Such a circuit may be used for, for example, additional processing of a signal from a transducer as described above or for other purposes.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. An apparatus for pulse slimming a read signal from a transducer head on a mass storage device comprising:
   A. circuitry for delaying said read signal by different delays to establish predetermined time differences between a peak of an expected read signal and predetermined positions in the leading and trailing edges, respectively, of the expected read signal to produce first, second, and third intermediate signals corresponding respectively to said predetermined leading edge position, said peak, and said predetermined trailing edge position, said first and second intermediate signals being delayed by different delays with respect to said third intermediate signal; and B. circuitry for differentially amplifying said intermediate signals to produce an output difference signal proportional to the second intermediate signal minus the sum of portions of the first and third intermediate signals.

2. An apparatus as in claim 1 wherein said read signal comprises a pulse having a pulse width defined by the time duration between points on said leading and trailing edges that have amplitudes equal to one half of said peak, said circuitry for delaying said read signal comprising a delay line for delaying said first intermediate signal by a duration equal to said pulse width with respect to said third intermediate signal, and for delaying said second intermediate signal by one half of said pulse width with respect to said third intermediate signal.

3. An apparatus as in claim 1 wherein said differential amplifying circuitry comprises
a pair of differential amplifiers, a first one of said pair of differential amplifiers having the second intermediate signal and the third intermediate signal applied as inputs thereto, and a second one of said pair of differential amplifiers having the second intermediate signal and the first intermediate signal applied as inputs thereto, and
circuitry for buffering output signals produced by said pair of differential amplifiers in response to the intermediate signals to produce said output difference signal 4. An apparatus as in claim 3 wherein each one of said differential amplifiers comprises a pair of transistors for producing the output signals of said differential amplifier, the pairs of transistors being arranged to couple current to a corresponding pair of common current source nodes, and further comprising
a pair of current sources respectively coupled to said common current source nodes, each current source controlling an amount of current coupled from the common current source node coupled thereto such that the output signals produced by each pair of transistors comprise differential signals representative of the relationship between the intermediate signals applied as inputs thereto.

5. An apparatus in claim 1 wherein
said differential amplifying circuitry comprises a pair of differential amplifiers, and
said circuitry for delaying includes an input node, an output node, and a delay output, said circuitry for delaying receiving said read signal at said input node and transmitting through the output node said first intermediate signal corresponding to the read signal delayed in time, said circuitry for delaying transmitting through said delay output said second intermediate signal corresponding to the read signal delayed a lesser amount in time, the signal at said input node being the third intermediate signal, said second intermediate signal being applied as an input to both of said pair of differential amplifiers contemporaneously, and the third intermediate signal and the first intermediate signal being applied as inputs to different ones of said pair of differential amplifiers.

6. The apparatus of claim 5 wherein said input node and said output node each include a voltage divider for reducing amplitudes of said third intermediate signal and said first intermediate signal, respectively, to selected fractions of the amplitudes of such signals at the respective nodes.

7. An apparatus for pulse slimming a read signal from a transducer head on a mass storage device comprising:

A. circuitry for delaying said read signal by different delays to establish predetermined time differences between a peak of an expected read signal and predetermined positions in the leading and trailing edges, respectively, of the expected read signal to produce first, second, and third intermediate signals corresponding respectively to said predetermined leading edge position, said peak, and said predetermined trailing edge position, said first and second intermediate signals being delayed by different delays with respect to said third intermediate signal; and B. circuitry for differentially amplifying said intermediate signals to produce an output difference signal, said means for differentially amplifying said intermediate signals comprising a pair of differential amplifiers, each one of said pair of differential amplifiers including a pair of transistors, each one of said pair of transistors being controlled by an input signal,
said second intermediate signal controlling one of the pair of transistors in each of the pair of differential amplifiers, and the other transistors in the respective pair of differential amplifiers being separately controlled by the third intermediate signal and the first intermediate signal, respectively,
the transistors controlled by said second intermediate signal having outputs coupled to a first output node, and the transistors controlled by said third intermediate signal and said first intermediate signal having outputs coupled to a second output node, the difference between signals at said first and second output nodes being the output difference signal.

8. An apparatus as in claim 7 further including circuitry for buffering said output difference signal, said buffering circuitry being connected to said first and second output nodes for generating relative differential output signals in response to the signals at said nodes.

9. A method for pulse slimming a read signal from a transducer head on a mass storage device comprising the steps of A. generating a read pulse from the transducer head, said read pulse being generated in response to information recorded on media of said mass storage device so as to constitute an indication thereof;

B. delaying said read pulse by different delays to establish predetermined time differences between a peak of an expected read pulse and predetermined positions in its leading and trailing edges, respectively, to produce first, second, and third intermediate pulses corresponding respectively to said predetermined leading edge position, said peak, and said predetermined trailing edge position, said first and second intermediate pulses being delayed by different delays with respect to said third intermediate pulse; and C. substracting portions of the third and first intermediate pulses from the second intermediate pulse.

* * * * *